US012635158B2

(12) United States Patent
Fiorenza et al.

(10) Patent No.: US 12,635,158 B2
(45) Date of Patent: May 19, 2026

(54) GALLIUM NITRIDE SUPERJUNCTION TRANSISTOR

(71) Applicant: Analog Devices, Inc., Wilmington, MA (US)

(72) Inventors: James G. Fiorenza, Carlisle, MA (US); Guanghai Ding, Bedford, MA (US); Daniel Piedra, Somerville, MA (US)

(73) Assignee: Analog Devices, Inc., Wilmington, MA (US)

( * ) Notice: Subject to any disclaimer, the term of this patent is extended or adjusted under 35 U.S.C. 154(b) by 638 days.

(21) Appl. No.: 18/069,824

(22) Filed: Dec. 21, 2022

(65) Prior Publication Data

US 2024/0213354 A1 Jun. 27, 2024

(51) Int. Cl.
| | |
|---|---|
| *H10D 30/01* | (2025.01) |
| *H10D 30/47* | (2025.01) |
| *H10D 62/824* | (2025.01) |
| *H10D 62/832* | (2025.01) |
| *H10D 62/85* | (2025.01) |
| *H10D 64/00* | (2025.01) |
| *H10P 30/20* | (2026.01) |

(52) U.S. Cl.
CPC ......... *H10D 30/015* (2025.01); *H10D 30/475* (2025.01); *H10D 62/824* (2025.01); *H10D 62/8325* (2025.01); *H10D 62/8503* (2025.01); *H10D 64/111* (2025.01); *H10P 30/2042* (2026.01); *H10P 30/21* (2026.01)

(58) Field of Classification Search
CPC .............. H10D 30/015; H10D 30/475; H10D 62/8325; H10D 62/8503; H10D 64/111
See application file for complete search history.

(56) References Cited

U.S. PATENT DOCUMENTS

| | | | |
|---|---|---|---|
| 10,217,854 B1 * | 2/2019 | Lin | ...................... H10D 30/015 |
| 2013/0056746 A1 | 3/2013 | Joshin | |
| 2013/0334573 A1 * | 12/2013 | Ostermaier | ....... H01L 21/30604 |
| | | | 257/E21.403 |
| 2019/0013386 A1 | 1/2019 | Shinohara et al. | |
| 2020/0119179 A1 | 4/2020 | Mishra et al. | |
| 2021/0082911 A1 * | 3/2021 | Chiu | ...................... H10D 84/05 |
| 2022/0157981 A1 | 5/2022 | Gupta et al. | |

OTHER PUBLICATIONS

"European Application Serial No. 23209983.8, Response filed Dec. 16, 2024 to Extended European Search Report mailed May 6, 2024", 31 pgs.
"European Application Serial No. 23209983.8, Extended European Search Report mailed May 6, 2024", 8 pgs.

* cited by examiner

*Primary Examiner* — Syed I Gheyas
(74) *Attorney, Agent, or Firm* — Schwegman Lundberg & Woessner, P.A.

(57) ABSTRACT

Techniques to increase the number of current paths (or "channels") in a GaN transistor, without increasing the device area, thereby decreasing the on-resistance. In addition, this disclosure describes techniques to utilize back-side field management to improve the device's performance. For example, the techniques can include using p-type implantation into the substrate, e.g., silicon carbide (SiC), as a field management tool to form a superjunction device, thereby increasing the effective field and reducing the on-resistance multiplied by the output charge (Qoss).

18 Claims, 6 Drawing Sheets

100

200

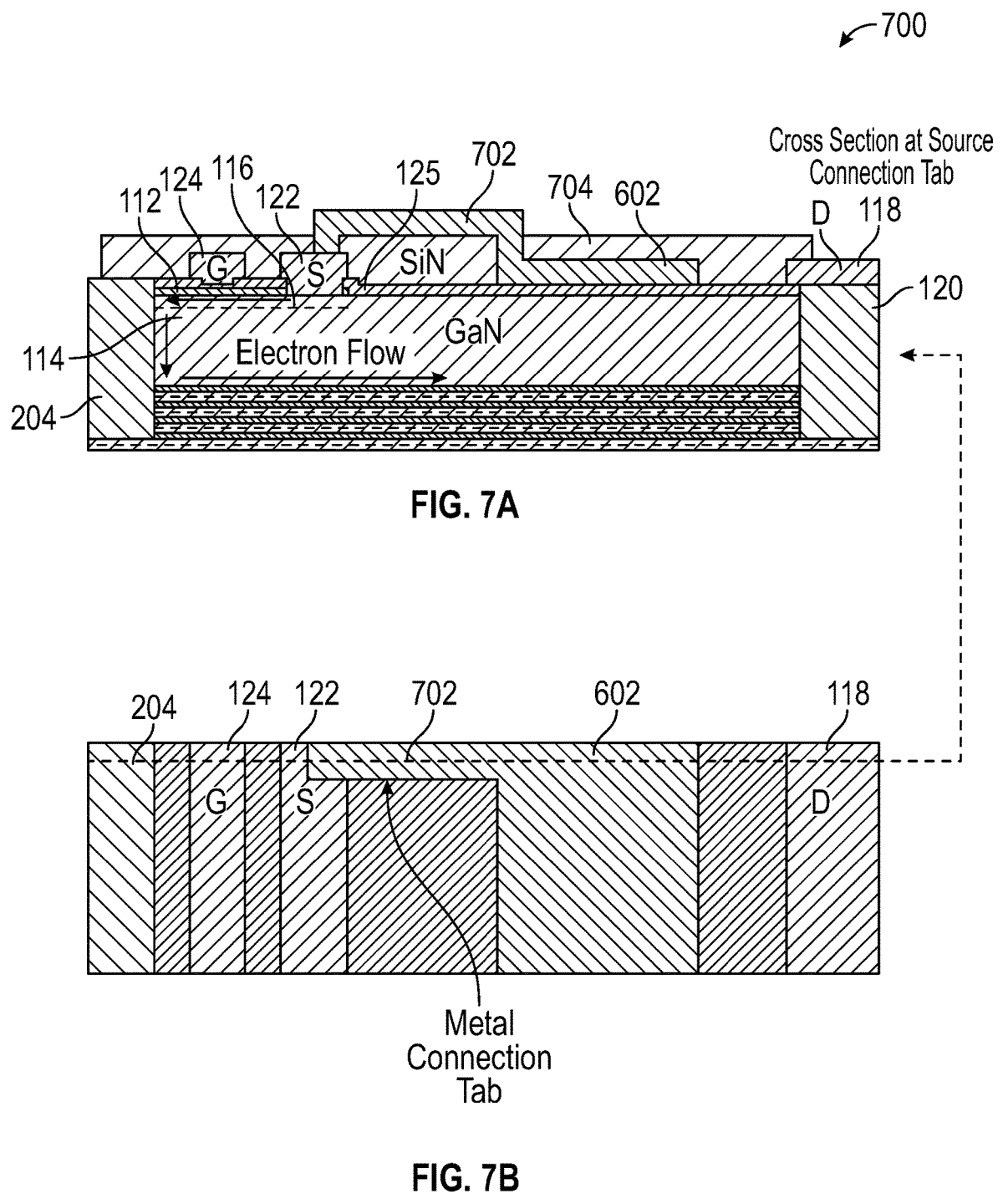

700

112 124 116 122    125 702    704 602    Cross Section at Source Connection Tab    D 118

G    S    SiN    120

GaN

114    Electron Flow

Metal Connection Tab

FIG. 7B

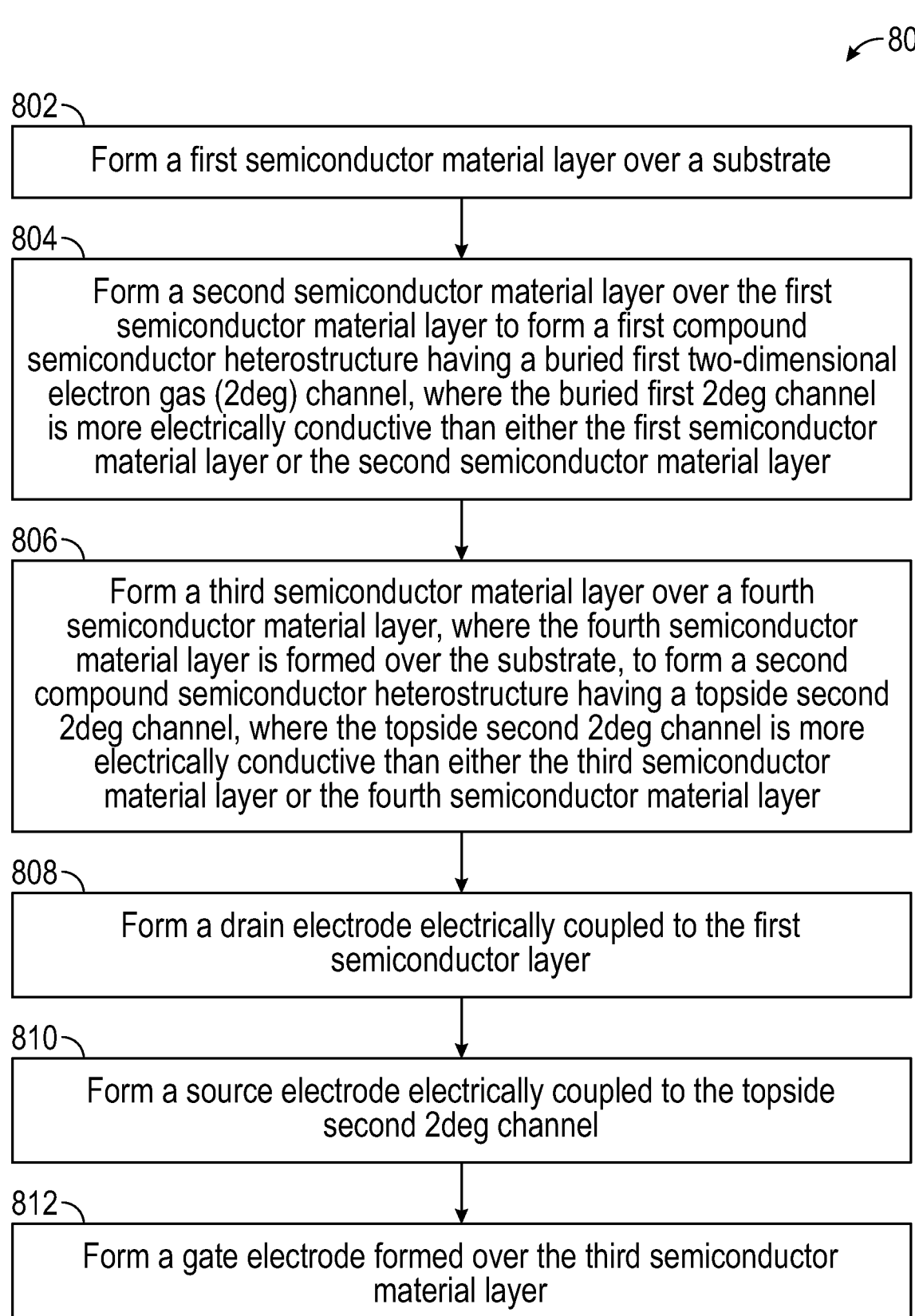

802 — Form a first semiconductor material layer over a substrate

804 — Form a second semiconductor material layer over the first semiconductor material layer to form a first compound semiconductor heterostructure having a buried first two-dimensional electron gas (2deg) channel, where the buried first 2deg channel is more electrically conductive than either the first semiconductor material layer or the second semiconductor material layer 806 — Form a third semiconductor material layer over a fourth semiconductor material layer, where the fourth semiconductor material layer is formed over the substrate, to form a second compound semiconductor heterostructure having a topside second 2deg channel, where the topside second 2deg channel is more electrically conductive than either the third semiconductor material layer or the fourth semiconductor material layer 808 — Form a drain electrode electrically coupled to the first semiconductor layer 810 — Form a source electrode electrically coupled to the topside second 2deg channel 812 — Form a gate electrode formed over the third semiconductor material layer

FIG. 8

GALLIUM NITRIDE SUPERJUNCTION TRANSISTOR

FIELD OF THE DISCLOSURE

This document pertains generally, but not by way of limitation, to semiconductor devices, and more particularly, to techniques for constructing gallium nitride devices.

BACKGROUND

Gallium nitride (GaN) based semiconductors offer several advantages over other semiconductors as the material of choice for fabricating the next generation of transistors, or semiconductor devices, for use in both high voltage and high frequency applications. GaN based semiconductors, for example, have a wide bandgap that enable devices fabricated from these materials to have a high breakdown electric field and to be robust to a wide range of temperatures.

The two-dimensional electron gas (2DEG) channels formed by GaN based heterostructures generally have high electron mobility, making devices fabricated using these structures useful in power-switching and amplification systems. GaN based semiconductors, however, are typically used to fabricate depletion mode (or normally on) devices, which can have limited use in many of these systems, such as due to the added circuit complexity required to support such devices.

SUMMARY OF THE DISCLOSURE

This disclosure describes techniques to increase the number of current paths (or "channels") in a GaN transistor, without increasing the device area, thereby decreasing the on-resistance. In addition, this disclosure describes techniques to utilize back-side field management to improve the device's performance. For example, the techniques can include using p-type implantation into the substrate, e.g., silicon carbide (SiC), as a field management tool to form a superjunction device, thereby increasing the effective field and reducing the on-resistance multiplied by the output charge (Qoss).

In some aspects, this disclosure is directed to a compound semiconductor heterostructure transistor device having multiple two-dimensional electron gas channels, the compound semiconductor heterostructure transistor device comprising: a substrate; a first semiconductor material layer formed over the substrate; a second semiconductor material layer formed over the first semiconductor material to form a first compound semiconductor heterostructure having a buried first two-dimensional electron gas (2DEG) channel, wherein the buried first 2DEG channel is more electrically conductive than either the first semiconductor material layer or the second semiconductor material layer; a third semiconductor material layer formed over a fourth semiconductor material layer, wherein the fourth semiconductor material layer is formed over the substrate, to form a second compound semiconductor heterostructure having a topside second 2DEG channel, wherein the topside second 2DEG channel is more electrically conductive than either the third semiconductor material layer or the fourth semiconductor material layer; a drain electrode electrically coupled to the first semiconductor layer; a source electrode electrically coupled to the topside second 2DEG channel; and a gate electrode formed over the third semiconductor material layer.

In some aspects, this disclosure is directed to a method of forming a compound semiconductor heterostructure transistor device, the method comprising: forming a first semiconductor material layer over a substrate; forming a second semiconductor material layer over the first semiconductor material layer to form a first compound semiconductor heterostructure having a buried first two-dimensional electron gas (2DEG) channel, wherein the buried first 2DEG channel is more electrically conductive than either the first semiconductor material layer or the second semiconductor material layer; forming a third semiconductor material layer over a fourth semiconductor material layer, wherein the fourth semiconductor material layer is formed over the substrate, to form a second compound semiconductor heterostructure having a topside second 2DEG channel, wherein the topside second 2DEG channel is more electrically conductive than either the third semiconductor material layer or the fourth semiconductor material layer; forming a drain electrode electrically coupled to the first semiconductor material layer; forming a source electrode electrically coupled to the topside second 2DEG channel; and forming a gate electrode formed over the third semiconductor material layer.

In some aspects, this disclosure is directed to a compound semiconductor heterostructure transistor device having multiple two-dimensional electron gas channels, the compound semiconductor heterostructure transistor device comprising: a substrate; a first semiconductor material layer formed over the substrate; a second semiconductor material layer formed over the first semiconductor material to form a first compound semiconductor heterostructure having a buried first two-dimensional electron gas (2DEG) channel, wherein the buried first 2DEG channel is more electrically conductive than either the first semiconductor material layer or the second semiconductor material layer; a third semiconductor material layer formed over a fourth semiconductor material layer, wherein the fourth semiconductor material layer is formed over the substrate, to form a second compound semiconductor heterostructure having a topside second 2DEG channel, wherein the topside second 2DEG channel is more electrically conductive than either the third semiconductor material layer or the fourth semiconductor material layer; a first doped semiconductor material extending vertically between and electrically coupling the second semiconductor material layer and the third semiconductor material layer; a drain electrode electrically coupled to the first semiconductor material layer; a source electrode electrically coupled to the topside second 2DEG channel; and a first gate electrode formed over the third semiconductor material layer, wherein the first gate electrode is positioned between the source electrode and the drain electrode and positioned adjacent a first side of the source electrode; a second gate electrode positioned adjacent a second side of the source electrode; and a conductive material extending vertically between and electrically coupling the buried first 2DEG channel and the topside second 2DEG channel.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 7A depicts a cross-sectional diagram of a portion of the compound semiconductor heterostructure transistor device of FIG. 6A after the metal field plate is electrically tied to the source electrode.

FIG. 7B is a top view of the compound semiconductor heterostructure transistor device of FIG. 7A.

FIG. 8 is an example of a flow diagram of a method of forming a compound semiconductor heterostructure transistor device, in accordance with various techniques of this disclosure.

DETAILED DESCRIPTION

Figure 1:
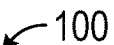
FIG. 1 depicts a cross-sectional diagram of an example of a compound semiconductor heterostructure transistor device having multiple two-dimensional electron gas (2DEG) channels that can implement various techniques of this disclosure.
Figure 1:
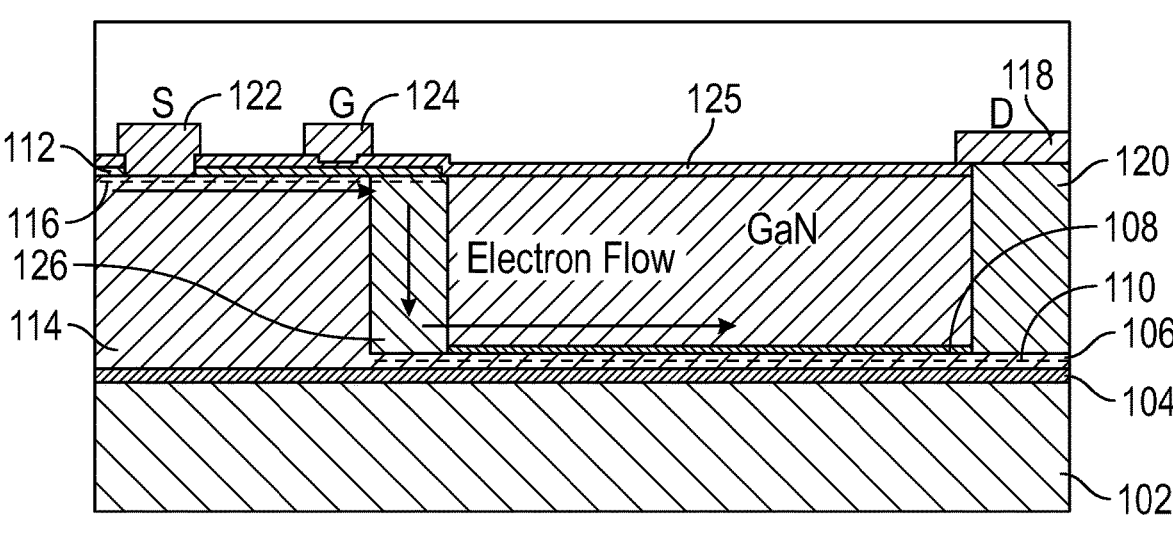

Gallium nitride (GaN) based semiconductors are an attractive option for high frequency and high-power applications. GaN technology, however, still has challenges with managing the high electric fields present in the device. Presently, top-side field plates (which are also referred to as front-side field plates) are the primary technique used to reduce the electric field to protect the device. Silicon power devices can use both back-side and top-side field plates, which can be more effective at electric field management than using only top-side field plates.

Today's GaN transistors are made without taking advantage of field management from the bottom of the device. Therefore, the on-resistance multiplied by the area of the device and the on-resistance multiplied by the output charge is higher than it should be. For a given device area, it is desirable to have the highest amount of current, which results in lowest amount of on-resistance (Ron), which results in a better power device. In addition, lack of field management from the back-side of the wafer is one reason that GaN FETs have performance that is significantly below the performance predicted based on the high critical field and mobility.

A typical GaN transistor has one path for current flow. The present inventors have recognized that by introducing a second path for current flow, the amount of current in a GaN transistor can be doubled without changing the device area. For the same size GaN transistor, there is twice the current and half the on-resistance.

This disclosure describes techniques to increase the number of current paths (or "channels") in a GaN transistor, without increasing the device area, thereby decreasing the on-resistance. In addition, this disclosure describes techniques to utilize back-side field management to improve the device's performance. For example, the techniques can include using p-type implantation into the substrate, e.g., silicon carbide (SiC), as a field management tool to form a superjunction device, thereby increasing the effective field and reducing the on-resistance multiplied by the output charge (Qoss).

As used in this disclosure, a GaN-based compound semiconductor material can include a chemical compound of elements including GaN and one or more elements from different groups in the periodic table. Such chemical compounds can include a pairing of elements from group 13 (i.e., the group comprising boron (B), aluminum (Al), gallium (Ga), indium (In), and thallium (Tl)) with elements from group 15 (i.e., the group comprising nitrogen (N), phosphorus (P), arsenic (As), antimony (Sb), and bismuth (Bi)). Group 13 of the periodic table can also be referred to as Group III and group 15 as Group V. In an example, a semiconductor device can be fabricated from GaN and aluminum indium gallium nitride (AlInGaN).

Heterostructures described herein can be formed as AlN/GaN/AlN heterostructures, InAlN/GaN heterostructures, AlGaN/GaN heterostructures, or heterostructures formed from other combinations of group 13 and group 15 elements. These heterostructures can form a two-dimensional electron gas (2DEG) at the interface of the compound semiconductors that form the heterostructure, such as the interface of GaN and AlGaN. The 2DEG can form a conductive channel of electrons that can be controllably depleted, such as by an electric field formed by a buried layer of p-type material disposed below the channel. The conductive channel of electrons that can also be controllably enhanced, such as by an electric field formed by a gate terminal disposed above the channel to control a current through the semiconductor device. Semiconductor devices formed using such conductive channels can include high electron mobility transistors.

FIG. 1 depicts a cross-sectional diagram of an example of a compound semiconductor heterostructure transistor device 100 having multiple two-dimensional electron gas (2DEG) channels that can implement various techniques of this disclosure. The compound semiconductor heterostructure transistor device 100 includes a substrate 102, such as silicon carbide (SiC). In this example, the compound semiconductor heterostructure transistor device 100 includes an optional nucleation layer 104, such as aluminum nitride (AlN), formed over the substrate 102.

The compound semiconductor heterostructure transistor device 100 includes a first semiconductor material layer 106, such as gallium nitride (GaN), formed over the substrate 102, such as over the optional nucleation layer 104. A second semiconductor material layer 108, such as aluminum gallium nitride (AlGaN), is formed over the first semiconductor material layer 106 to form a first compound semiconductor heterostructure having a buried first two-dimensional electron gas (2DEG) channel 110 (represented by a dashed line). The buried first 2DEG channel 110 is more electrically conductive than either the first semiconductor material layer 106 or the second semiconductor material layer 108.

The compound semiconductor heterostructure transistor device 100 further includes a third semiconductor material layer 112, such as AlGaN, formed over a fourth semiconductor material layer 114, such as GaN, where the fourth semiconductor material layer 114 is formed over the substrate 102. The third semiconductor material layer 112 and the fourth semiconductor material layer 114 form a second compound semiconductor heterostructure having a topside second 2DEG channel 116 (represented by a dashed line). The topside second 2DEG channel 116 is more electrically conductive than either the third semiconductor material layer 112 or the fourth semiconductor material layer 114.

A drain electrode 118 is electrically coupled to the 2DEG channel 110 and to the first semiconductor material layer 106 by a conductive material 120, such as a doped semiconductor material, e.g., highly doped GaN, or a metal. In some examples, vias can be etched through the fourth semiconductor material layer 114, e.g., undoped GaN, and then highly doped GaN, e.g., doped with silicon (Si), can be regrown in the etched regions. The conductive material 120 will have a lower resistance than the undoped fourth semiconductor material layer 114.

A source electrode 122 is electrically coupled to the topside second 2DEG channel 116. A gate electrode 124 is formed over the third semiconductor material layer 112. As seen in FIG. 1, the third semiconductor material layer 112 does not underlie completely between the source electrode 122 and the drain electrode 118. The compound semiconductor heterostructure transistor device 100 can include an optional passivation layer 125, such as silicon nitride (SiN).

The compound semiconductor heterostructure transistor device 100 in FIG. 1 includes a doped semiconductor material 126, e.g., n+ GaN, extending vertically between and electrically coupling the second semiconductor material layer 108 and the third semiconductor material layer 112. The doped semiconductor material 126 electrically couples the two 2DEG channels 116, 110. The doped semiconductor material 126 allows electrons to flow from the source electrode rightward toward and then down the doped semiconductor material 126, rightward toward the conductive material 120, and upward to the drain electrode 118, as shown by the arrows in FIG. 1.

Figure 4:
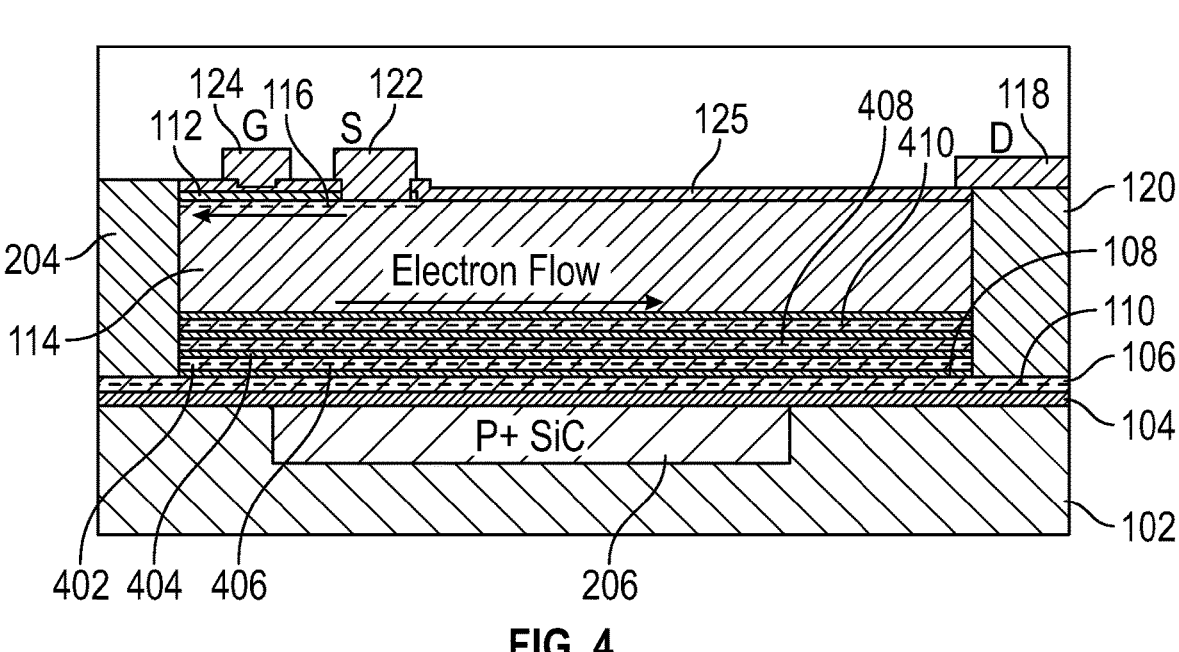
FIG. 4 depicts a cross-sectional diagram of another example of a compound semiconductor heterostructure transistor device having multiple two-dimensional electron gas (2DEG) channels that can implement various techniques of this disclosure.
Figure 5:
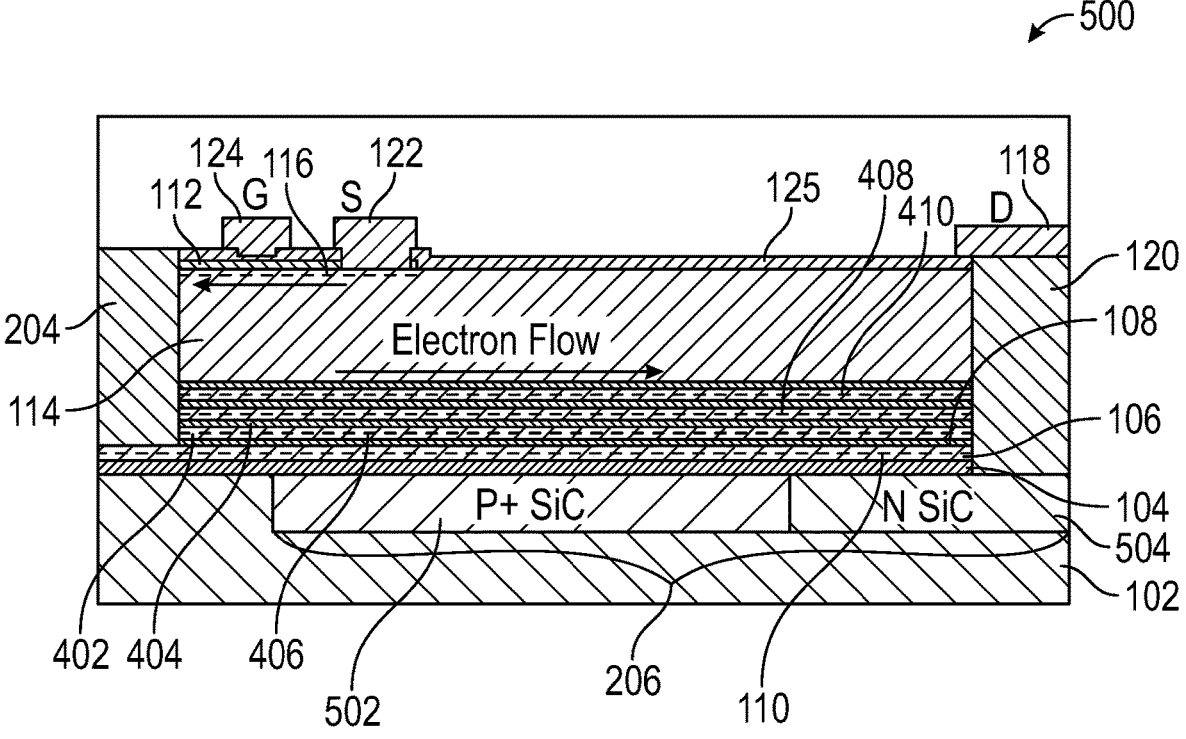
FIG. 5 depicts a cross-sectional diagram of another example of a compound semiconductor heterostructure transistor device having multiple two-dimensional electron gas (2DEG) channels that can implement various techniques of this disclosure.

The buried 2DEG channel provides the advantage of less electric field at the surface of the device. As shown in FIGS. 4-6, multiple buried channels can be included.

Figure 2:
FIG. 2 depicts a cross-sectional diagram of another example of a compound semiconductor heterostructure transistor device having multiple two-dimensional electron gas (2DEG) channels that can implement various techniques of this disclosure.
Figure 2:
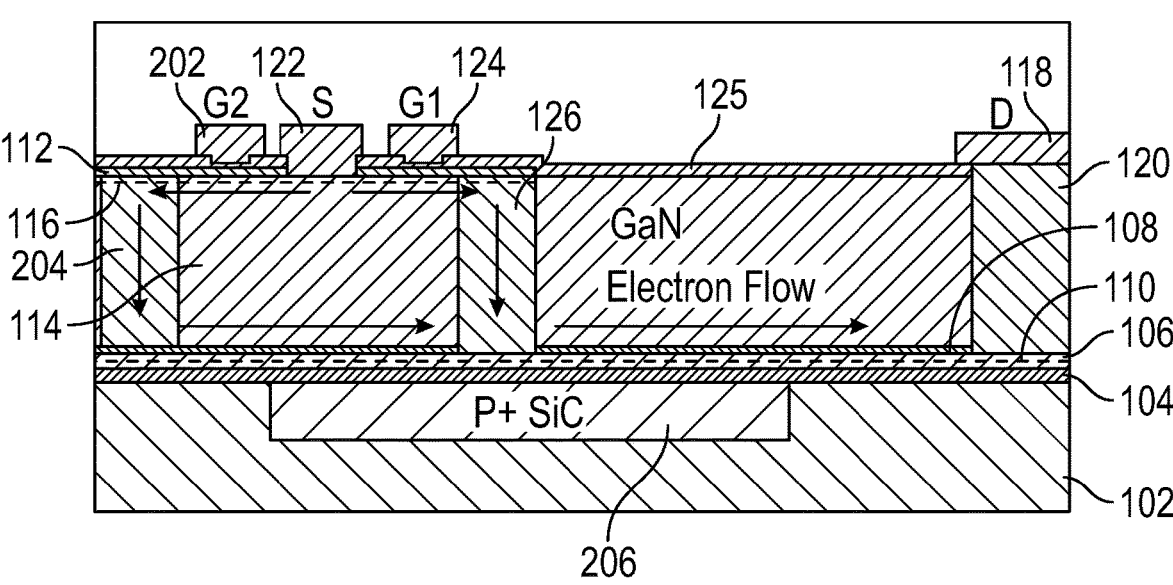

FIG. 2 depicts a cross-sectional diagram of another example of a compound semiconductor heterostructure transistor device 200 having multiple two-dimensional electron gas (2DEG) channels that can implement various techniques of this disclosure. Some of the features of the compound semiconductor heterostructure transistor device 200 are similar to features of the compound semiconductor heterostructure transistor device 100 of FIG. 1 and, as such, use similar reference numbers. For purposes of conciseness, similar features will not be described in detail again.

The compound semiconductor heterostructure transistor device 200 includes two gate electrodes: a first gate electrode 124 and a second gate electrode 202. The first gate electrode 124 is positioned between the source electrode 122 and the drain electrode 118 and positioned adjacent a right side of the source electrode 122. The second gate electrode 202 is positioned adjacent a left side of the source electrode 122.

The compound semiconductor heterostructure transistor device 200 further includes a conductive material 204, such as a doped semiconductor material, e.g., highly doped GaN, or a metal. The conductive material 204 extends vertically between and electrically couples the buried first 2DEG channel 110 and the topside second 2DEG channel 116. In contrast to FIG. 1, the buried first 2DEG channel 110 in FIG. 2 extends leftward beyond the doped semiconductor material 126 and electrically couples to the conductive material 204. In addition, the topside second 2DEG channel 116 extends leftward beyond the source electrode 122, under the second gate electrode 202 and electrically couples to the conductive material 204. In addition, the third semiconductor material layer 112 does not underlie completely between the source electrode 122 and the drain electrode 118.

Like in FIG. 1, the doped semiconductor material 126 allows electrons to flow from the source electrode 122 rightward toward and then down the doped semiconductor material 126, rightward toward the conductive material 120, and then upward to the drain electrode 118, as shown by the arrows in FIG. 1. In addition, the conductive material 204 in FIG. 2 also allows electrons to flow from the source electrode 122 leftward toward and then down the conductive material 204, rightward toward the conductive material 120, and upward to the drain electrode 118.

The compound semiconductor heterostructure transistor device 200 further includes a dopant layer 206 implanted in the substrate 102. In the example shown, the dopant layer 206 includes a p-type material forming a first region. The p-type material can act like a back-side field plate. The p-type material can be lightly doped such that it depletes out at the same rate that the electrons deplete out in the buried first 2DEG channel 110. This can achieve a charge balance between the electrons in the 2DEG channel 110 and the holes in the p-type material, which can help control the electric fields, thereby creating a superjunction. The implanted p-type SiC can provide a more uniform (and less peaky) electric field to create a superjunction.

The superjunction techniques relates to the instances with the p-type SiC, such as shown in FIGS. 2-5. The balance of the n-type GaN channel and the p-type SiC region is what makes the superjunction. In this region there should be a more uniform, flat electric field profile, which can enable higher voltages before the device would breakdown.

Figure 3:
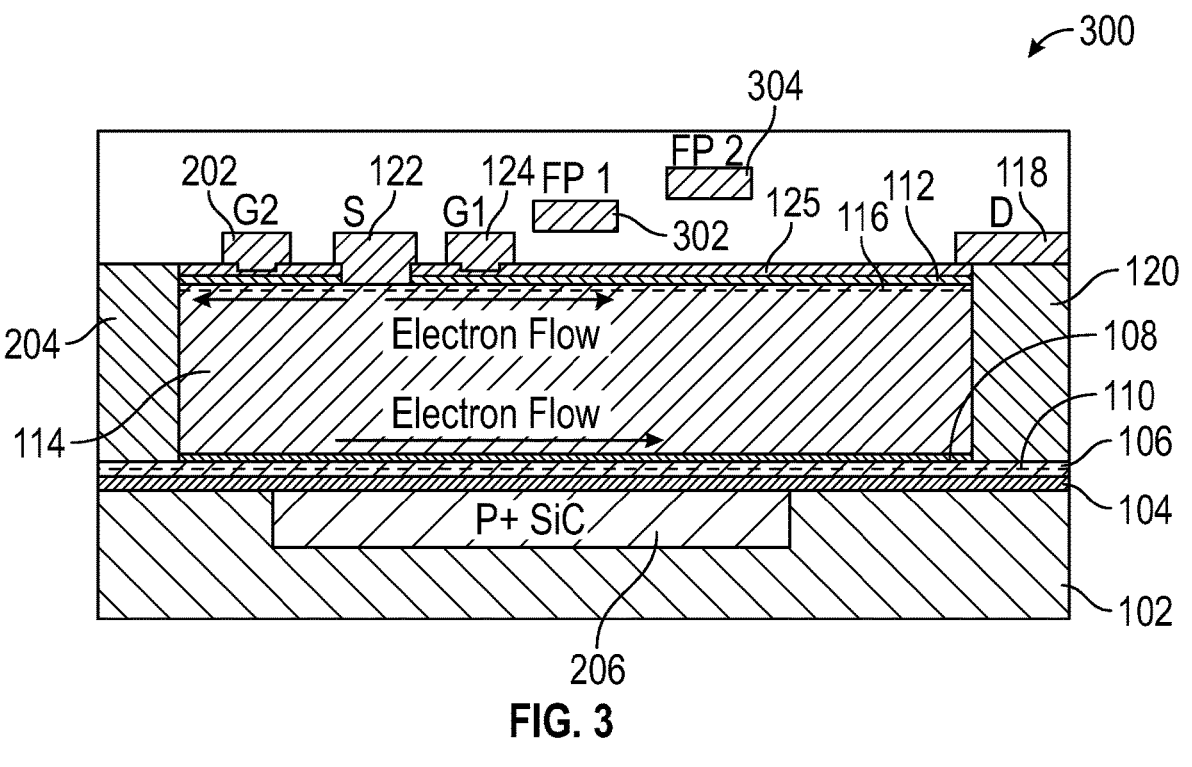
FIG. 3 depicts a cross-sectional diagram of another example of a compound semiconductor heterostructure transistor device having multiple two-dimensional electron gas (2DEG) channels that can implement various techniques of this disclosure.

FIG. 3 depicts a cross-sectional diagram of another example of a compound semiconductor heterostructure transistor device 300 having multiple two-dimensional electron gas (2DEG) channels that can implement various techniques of this disclosure. Some of the features of the compound semiconductor heterostructure transistor device 300 are similar to features of the compound semiconductor heterostructure transistor device 100 of FIG. 1 and the compound semiconductor heterostructure transistor device 200 of FIG. 2 and, as such, use similar reference numbers. For purposes of conciseness, similar features will not be described in detail again.

The compound semiconductor heterostructure transistor device 300 of FIG. 3 includes two gate electrodes 124, and 202, like in FIG. 2. Unlike the devices shown in FIGS. 1 and 2, the compound semiconductor heterostructure transistor device 300 does not include the doped semiconductor material 126 that extends vertically between the topside second 2DEG channel 116 and the buried first 2DEG channel 110. Further, the third semiconductor material layer 112 underlies completely between the source electrode 122 and the drain electrode 118.

In the configuration shown in FIG. 3, electrons flow 1) from the source electrode rightward toward the drain electrode 118 and 2) from the source leftward, down the conductive material 204, rightward toward the conductive material 120, and upward to the drain electrode 118, as shown by the arrows in FIG. 3. The multiple 2DEG channels 110, 116 result in a compound semiconductor heterostructure transistor device 300 that has less on-resistance than a transistor device with only one 2DEG channel.

The compound semiconductor heterostructure transistor device 300 can include a field plate 302 formed over the third semiconductor material layer 112. The field plate 302 can control electric fields on the topside of the device. In some examples, the compound semiconductor heterostructure transistor device 300 can include a second field plate 304 formed over the third semiconductor material layer 112. A dielectric material can be formed under the field plate 302 and, if present, the second field plate 304.

FIG. 4 depicts a cross-sectional diagram of another example of a compound semiconductor heterostructure transistor device 400 having multiple two-dimensional electron gas (2DEG) channels that can implement various techniques of this disclosure. Some of the features of the compound semiconductor heterostructure transistor device 400 are similar to features of the compound semiconductor heterostructure transistor devices of FIGS. 1-3 and, as such, use similar reference numbers. For purposes of conciseness, similar features will not be described in detail again.

Unlike the compound semiconductor heterostructure transistor device 300 of FIG. 3, the compound semiconductor heterostructure transistor device 400 includes one gate electrode 124. In FIG. 4, the source electrode 122 is positioned between the gate electrode 124 and the drain electrode 118. In addition, the third semiconductor material layer 112 of FIG. 4 does not underlie completely between the source electrode 122 and the drain electrode 118.

In contrast to the devices shown in FIGS. 1-3, the compound semiconductor heterostructure transistor device 400 includes multiple buried 2DEG channels. In FIGS. 1-3, the devices include a single buried 2DEG channel 110. In FIG. 4, there are four buried 2DEG channels. Other configurations can include fewer than four buried 2DEG channels or more than four buried 2DEG channels.

A fifth semiconductor material layer 402, e.g., GaN, is formed over the second semiconductor material layer 108. A sixth semiconductor material layer 404, e.g., AlGaN, is formed over the fifth semiconductor material layer 402 to form a third compound semiconductor heterostructure having a buried third 2DEG channel 406, where the buried third 2DEG channel is more electrically conductive than either the fifth semiconductor material layer or the sixth semiconductor material layer. Additional layering of semiconductor materials, such as alternating layers of GaN and AlGaN, results in additional buried 2DEG channels 408, 410. The conductive material 204 extends vertically between and electrically couples the buried 2DEG channels 110, 406, 408, and 410 and the topside 2DEG channel 116.

In the configuration shown in FIG. 4, electrons flow from the source leftward, down the conductive material 204, rightward through the buried 2DEG channels 110, 406, 408, and 410, and then upward to the drain electrode 118, as shown by the arrows in FIG. 4. These multiple 2DEG channels 110, 116, 406, 408, and 410 result in a compound semiconductor heterostructure transistor device 400 that has less on-resistance than a transistor device with only one 2DEG channel.

FIG. 5 depicts a cross-sectional diagram of another example of a compound semiconductor heterostructure transistor device 500 having multiple two-dimensional electron gas (2DEG) channels that can implement various techniques of this disclosure. Some of the features of the compound semiconductor heterostructure transistor device 500 are similar to features of the compound semiconductor heterostructure transistor device 400 of FIG. 4 and, as such, use similar reference numbers. For purposes of conciseness, similar features will not be described in detail again.

The compound semiconductor heterostructure transistor device 500 is similar to the compound semiconductor heterostructure transistor device 400 of FIG. 4 except for the dopant layer 206. The dopant layer 206 includes a p-type material forming a first region 502 and an n-type material forming a second region 504. The first region 502 is adjacent the second region 504, and the first region 502 and the second region 504 form a p-n junction diode.

Figure 6A:
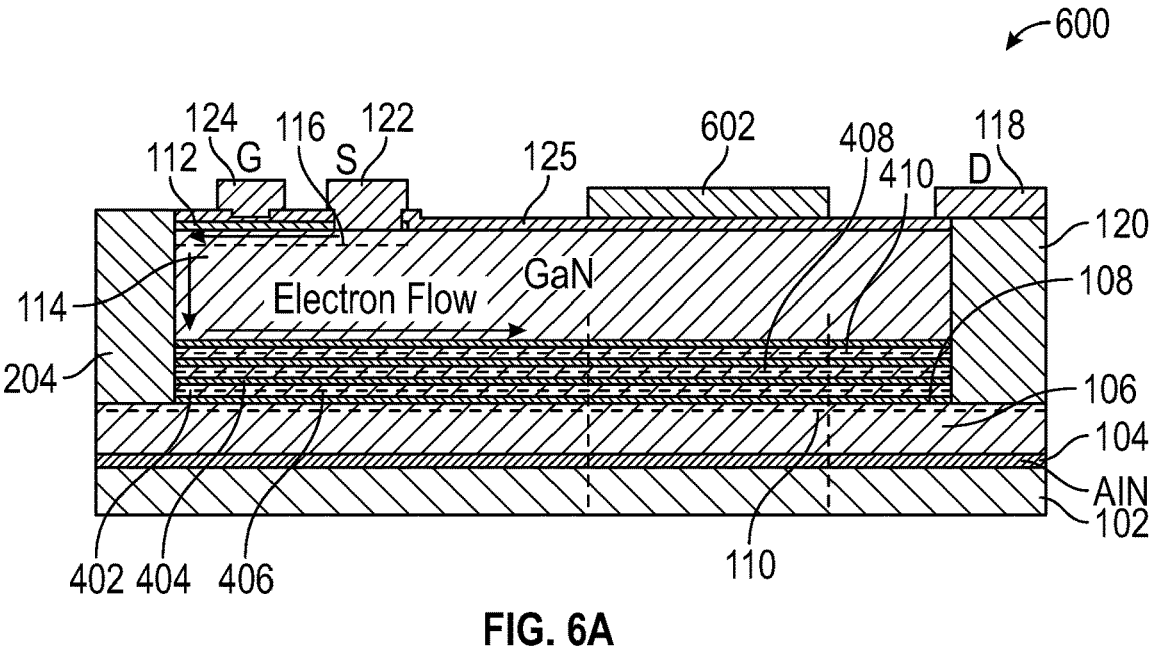
FIG. 6A depicts a cross-sectional diagram of another example of a compound semiconductor heterostructure transistor device 600 having multiple two-dimensional electron gas (2DEG) channels that can implement various techniques of this disclosure.

FIG. 6A depicts a cross-sectional diagram of another example of a compound semiconductor heterostructure transistor device 600 having multiple two-dimensional electron gas (2DEG) channels that can implement various techniques of this disclosure. Some of the features of the compound semiconductor heterostructure transistor device 600 are similar to features of the compound semiconductor heterostructure transistor devices of FIGS. 4 and 5 and, as such, use similar reference numbers. For purposes of conciseness, similar features will not be described in detail again.

Cost is a drawback to using silicon carbide as a substrate 102. Silicon carbide is much more expensive than silicon. The compound semiconductor heterostructure transistor device 600 can use silicon as a substrate 102 by including a metal field plate 602 positioned between the source electrode 122 and the drain electrode 118 and positioned above the fourth semiconductor material layer 114. The metal field plate 602 can be electrically tied to the source electrode 122, as shown in FIGS. 7A and 7B, and can act like a topside field plate to control the electric field. As seen in FIG. 6C, after etching, a 3-dimensional fin 603 is formed having a width WFIN. The width WFIN of the fin 603 can be adjusted to control the threshold voltage at which the metal field plate 602 turns on. The smaller the width WFIN, the smaller the magnitude of the threshold voltage since there can be more depletion from the sidewalls of the fin 603 and less 2DEG to turn off.

Figure 6B:
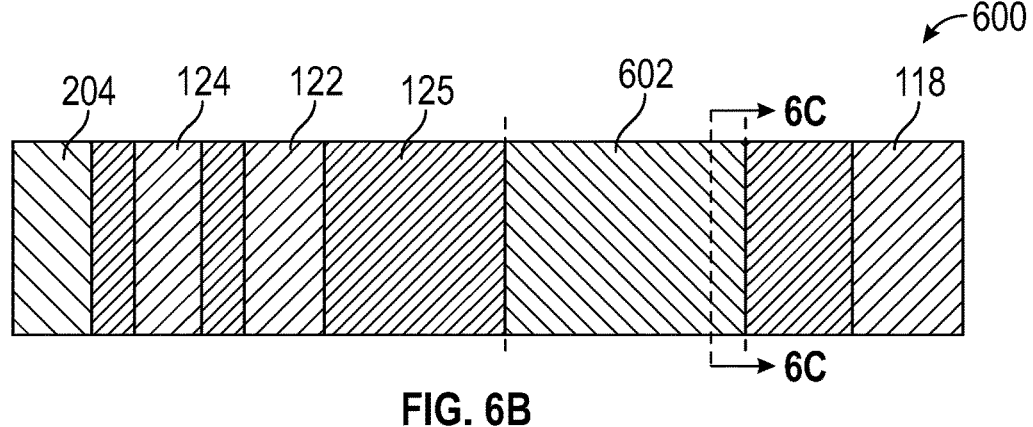
FIG. 6B is a top view of the compound semiconductor heterostructure transistor device of FIG. 6A.
Figure 6C:
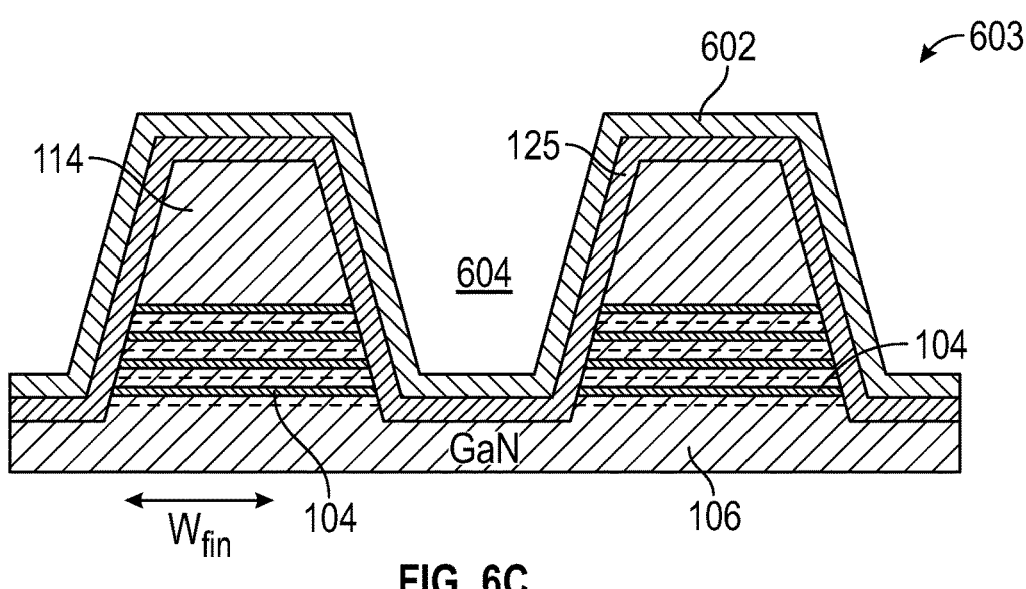
FIG. 6C is a cross-sectional diagram taken along line A-A in FIG. 6B.

FIG. 6B is a top view of the compound semiconductor heterostructure transistor device 600 of FIG. 6A. Before the optional passivation layer 125 is included, etching can be performed in the region under where the metal field plate 602 will be placed to etch down through the various semiconductor material layers and through the 2DEG channels to the first semiconductor material layer 106, which is best shown in FIG. 6C.

FIG. 6C is a cross-sectional diagram taken along line A-A in FIG. 6B. After the etching has been performed to create one or more etched regions 604 in the region under where the metal field plate 602 will be placed, a metal can conformally cover the etched region 604 (valleys) and the unetched regions (peaks) so as to form the metal field plate 602. Optionally, a passivation layer 125 can be formed before the metal is applied.

FIG. 7A depicts a cross-sectional diagram of a portion of the compound semiconductor heterostructure transistor device of FIG. 6A after the metal field plate 602 is electrically tied to the source electrode 122. Some of the features of the compound semiconductor heterostructure transistor device 700 of FIG. 7A are similar to features of the compound semiconductor heterostructure transistor devices of FIGS. 4-6C and, as such, use similar reference numbers. For purposes of conciseness, similar features will not be described in detail again. In addition, for simplicity, some of the features of FIG. 6A are not shown in FIG. 7A, such as the substrate 102 and the nucleation layer 104.

In the example shown, the compound semiconductor heterostructure transistor device 700 includes a connection 702 formed over a passivation layer 704, e.g., silicon nitride or silicon oxide, to electrically connect the metal field plate 602 to the source electrode 122. To reduce the capacitance, it can be desirable for the connection 702 to extend only partially across the surface of the device, as shown.

FIG. 7B is a top view of the compound semiconductor heterostructure transistor device 700 of FIG. 7A. The connection 702, e.g., a metal tab, can be electrically connected toward a first end of the source electrode 122. In other examples, the connection 702 can be electrically connected toward a second end of the source electrode 122, or at some other location of the source electrode 122. In yet other examples, there can be more than one connection 702.

FIG. 8 is an example of a flow diagram of a method 800 of forming a compound semiconductor heterostructure transistor device, in accordance with various techniques of this disclosure. At block 802, the method 800 includes forming a first semiconductor material layer over a substrate. For example, a GaN layer 106 (FIG. 1) can be formed over a substrate 102, such as SiC.

At block 804, the method 800 includes forming a second semiconductor material layer over the first semiconductor material layer to form a first compound semiconductor heterostructure having a buried first two-dimensional electron gas (2DEG) channel, where the buried first 2DEG channel is more electrically conductive than either the first semiconductor material layer or the second semiconductor material layer. For example, an AlGaN layer 108 (FIG. 1) can be formed over the GaN layer 106 (FIG. 1). The buried first 2DEG channel 110 is more electrically conductive than either the AlGaN layer 108 or the GaN layer 106.

At block 806, the method 800 includes forming a third semiconductor material layer over a fourth semiconductor material layer, where the fourth semiconductor material layer is formed over the substrate, to form a second compound semiconductor heterostructure having a topside second 2DEG channel, where the topside second 2DEG channel is more electrically conductive than either the third semiconductor material layer or the fourth semiconductor material layer. For example, an AlGaN layer 112 (FIG. 1) can be formed over the GaN layer 114 (FIG. 1). The topside second 2DEG channel 116 is more electrically conductive than either the AlGaN layer 112 or the GaN layer 114.

At block 808, the method 800 includes forming a drain electrode electrically coupled to the first semiconductor layer. For example, a drain electrode 118 (FIG. 1) is electrically coupled to the GaN layer 106 (FIG. 1).

At block 810, the method 800 includes forming a source electrode electrically coupled to the topside second 2DEG channel. For example, a source electrode 122 is electrically coupled to the topside second 2DEG channel 116 (FIG. 1).

At block 812, the method 800 includes forming a gate electrode formed over the third semiconductor material layer. For example, a gate electrode 124 (FIG. 1) is formed over the AlGaN layer 112 (FIG. 1)

The method 800 optionally includes forming a first doped semiconductor material that extends vertically between and electrically couples the second semiconductor material layer and the third semiconductor material layer.

In some examples, the gate electrode is a first gate electrode, and the first gate electrode is positioned between the source electrode and the drain electrode and positioned adjacent a first side of the source electrode. In some such examples, the method 800 further comprises forming a second gate electrode positioned adjacent a second side of the source electrode and forming a conductive material that extends vertically between and electrically couples the buried first 2DEG channel and the topside second 2DEG channel.

The method 800 optionally includes forming a field plate over the third semiconductor material layer.

The method 800 optionally includes forming a fifth semiconductor material layer over the second semiconductor material layer; forming a sixth semiconductor material layer formed over the fifth semiconductor material layer to form a third compound semiconductor heterostructure having a buried third 2DEG channel, where the buried third 2DEG channel is more electrically conductive than either the fifth semiconductor material layer or the sixth semiconductor material layer; and forming a conductive material that extends vertically between and electrically couples the buried first 2DEG channel, the buried third 2DEG channel, and the topside second 2DEG channel.

The method 800 optionally includes etching away a portion of the fourth semiconductor material layer, the fifth semiconductor material layer, second semiconductor material layer, and the third semiconductor material layer, wherein the etched-away portion is positioned between the source electrode and the drain electrode and positioned above the fourth semiconductor material layer; and forming a metal field plate over the etched away portion.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A compound semiconductor heterostructure transistor device having multiple two-dimensional electron gas channels, the compound semiconductor heterostructure transistor device comprising:

a substrate;

a first semiconductor material layer formed over the substrate;

a second semiconductor material layer formed over the first semiconductor material to form a first compound semiconductor heterostructure having a buried first two-dimensional electron gas (2DEG) channel, wherein the buried first 2DEG channel is more electrically conductive than either the first semiconductor material layer or the second semiconductor material layer;

a third semiconductor material layer formed over a fourth semiconductor material layer, wherein the fourth semiconductor material layer is formed over the substrate, to form a second compound semiconductor heterostructure having a topside second 2DEG channel, wherein the topside second 2DEG channel is more electrically conductive than either the third semiconductor material layer or the fourth semiconductor material layer;

a drain electrode electrically coupled to the first semiconductor material layer;

a source electrode electrically coupled to the topside second 2DEG channel; and a gate electrode formed over the third semiconductor material layer, wherein the gate electrode is associated with only the topside second 2DEG channel and not associated with the buried first 2DEG channel; and a conductive material extending vertically and electrically coupling 1) the buried first 2DEG channel and 2) the topside second 2DEG channel, wherein a current through the buried first 2DEG channel is approximately the same as a current through the topside second 2DEG channel.

2. The compound semiconductor heterostructure transistor device of claim 1, comprising:

a first doped semiconductor material extending vertically between and electrically coupling the second semiconductor material layer and the third semiconductor material layer.

3. The compound semiconductor heterostructure transistor device of claim 2, wherein the gate electrode is a first gate electrode, wherein the first gate electrode is positioned between the source electrode and the drain electrode and positioned adjacent a first side of the source electrode, the compound semiconductor heterostructure transistor device further comprising:

a second gate electrode positioned adjacent a second side of the source electrode; and a conductive material extending vertically between and electrically coupling the buried first 2DEG channel and the topside second 2DEG channel.

4. The compound semiconductor heterostructure transistor device of claim 1, wherein the third semiconductor material layer underlies completely between the source electrode and the drain electrode.

5. The compound semiconductor heterostructure transistor device of claim 4, wherein the gate electrode is a first gate electrode, wherein the first gate electrode is positioned between the source electrode and the drain electrode and positioned adjacent a first side of the source electrode, the compound semiconductor heterostructure transistor device further comprising:

a second gate electrode positioned adjacent a second side of the source electrode;

a conductive material extending vertically between and electrically coupling the second semiconductor material layer and the third semiconductor material layer.

6. The compound semiconductor heterostructure transistor device of claim 5, further comprising:

a field plate formed over the third semiconductor material layer.

7. The compound semiconductor heterostructure transistor device of claim 1, wherein the third semiconductor material layer does not underlie completely between the source electrode and the drain electrode.

8. The compound semiconductor heterostructure transistor device of claim 7, wherein the source electrode is positioned between the gate electrode and the drain electrode, the compound semiconductor heterostructure transistor device further comprising:

a fifth semiconductor material layer formed over the second semiconductor material layer and a sixth semiconductor material layer formed over the fifth semiconductor material layer to form a third compound semiconductor heterostructure having a buried third 2DEG channel, wherein the buried third 2DEG channel is more electrically conductive than either the fifth semiconductor material layer or the sixth semiconductor material layer; and wherein the conductive material extending extends vertically and electrically couples coupling 1) the buried first 2DEG channel and 2) the buried third 2DEG channel, and 3) the topside second 2DEG channel with the 3) the buried third 2DEG channel.

9. The compound semiconductor heterostructure transistor device of claim 8, wherein the substrate includes silicon, the compound semiconductor heterostructure transistor device further comprising:

a metal field plate positioned between the source electrode and the drain electrode and positioned above the fourth semiconductor material layer.

10. The compound semiconductor heterostructure transistor device of claim 1, comprising:

a dopant layer implanted in the substrate, wherein the dopant layer includes a p-type material forming a first region.

11. The compound semiconductor heterostructure transistor device of claim 10, wherein the dopant layer further includes an n-type material forming a second region, wherein the first region is adjacent the second region, and wherein the first region and the second region form a p-n junction diode.

12. The compound semiconductor heterostructure transistor device of claim 1, wherein the substrate includes silicon carbide.

13. A method of forming a compound semiconductor heterostructure transistor device, the method comprising:

forming a first semiconductor material layer over a substrate;

forming a second semiconductor material layer over the first semiconductor material layer to form a first compound semiconductor heterostructure having a buried first two-dimensional electron gas (2DEG) channel, wherein the buried first 2DEG channel is more electrically conductive than either the first semiconductor material layer or the second semiconductor material layer;

forming a third semiconductor material layer over a fourth semiconductor material layer, wherein the fourth semiconductor material layer is formed over the substrate, to form a second compound semiconductor heterostructure having a topside second 2DEG channel, wherein the topside second 2DEG channel is more electrically conductive than either the third semiconductor material layer or the fourth semiconductor material layer;

forming a drain electrode electrically coupled to the first semiconductor material layer;

forming a source electrode electrically coupled to only the topside second 2DEG channel; and forming a gate electrode over the third semiconductor material layer; and forming a conductive material that extends vertically and electrically couples 1) the buried first 2DEG channel and 2) the topside second 2DEG channel, wherein a current through the buried first 2DEG channel is approximately the same as a current through the topside second 2DEG channel.

14. The method of claim 13, comprising:

forming a first doped semiconductor material that extends vertically between and electrically couples the second semiconductor material layer and the third semiconductor material layer.

15. The method of claim 14, wherein the gate electrode is a first gate electrode, wherein the first gate electrode is positioned between the source electrode and the drain electrode and positioned adjacent a first side of the source electrode, the method further comprising:

forming a second gate electrode positioned adjacent a second side of the source electrode; and forming a conductive material that extends vertically between and electrically couples the buried first 2DEG channel and the topside second 2DEG channel.

16. The method of claim 14, further comprising:

forming a field plate over the third semiconductor material layer.

17. The method of claim 13, further comprising:

forming a fifth semiconductor material layer over the second semiconductor material layer;

forming a sixth semiconductor material layer formed over the fifth semiconductor material layer to form a third compound semiconductor heterostructure having a buried third 2DEG channel, wherein the buried third 2DEG channel is more electrically conductive than either the fifth semiconductor material layer or the sixth semiconductor material layer; and wherein the forming a conductive material that extends vertically between and electrically couples the 1) buried first 2DEG channel and the buried third 2DEG channel, and 2) the topside second 2DEG channel with the 3) the buried third 2DEG channel.

18. The method of claim 17, further comprising:

etching away a portion of the fourth semiconductor material layer, the fifth semiconductor material layer, second semiconductor material layer, and the third semiconductor material layer, wherein the etched-away portion is positioned between the source electrode and the drain electrode and positioned above the fourth semiconductor material layer; and forming a metal field plate over the etched-away portion.

* * * * *